(12) United States Patent
Park et al.

(10) Patent No.: US 11,038,497 B2
(45) Date of Patent: *Jun. 15, 2021

(54) SEMICONDUCTOR DEVICE INCLUDING CLOCK GENERATION CIRCUIT

(71) Applicant: SK hynix Inc., Gyeonggi-do (KR)

(72) Inventors: Myeong-Jae Park, Gyeonggi-do (KR); Ji-Hwan Kim, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/829,834

(22) Filed: Mar. 25, 2020

(65) Prior Publication Data
US 2020/0228106 A1   Jul. 16, 2020

Related U.S. Application Data

(63) Continuation of application No. 16/156,613, filed on Oct. 10, 2018, now Pat. No. 10,637,452.

(30) Foreign Application Priority Data

Feb. 26, 2018   (KR) .................. 10-2018-0022738

(51) Int. Cl.
| | | |
|---|---|---|
| G06F 1/04 | (2006.01) | |
| H03K 5/135 | (2006.01) | |
| H03K 21/38 | (2006.01) | |
| G01R 31/317 | (2006.01) | |
| H03K 23/00 | (2006.01) | |
| G06F 1/10 | (2006.01) | |
| H03K 5/00 | (2006.01) | |

(52) U.S. Cl.
CPC ....... H03K 5/135 (2013.01); G01R 31/31727 (2013.01); G06F 1/04 (2013.01); G06F 1/10 (2013.01); H03K 21/38 (2013.01); H03K 23/002 (2013.01); H03K 2005/0015 (2013.01); H03K 2005/00078 (2013.01)

(58) Field of Classification Search
CPC ........... H03K 5/135; H03K 5/05; H03K 5/13; H03K 5/131; H03K 5/133; H03K 5/14; H03K 3/78; H03K 21/38; H03K 23/002; G01R 31/31727; G06F 1/04; G06F 1/10
See application file for complete search history.

(56) References Cited

U.S. PATENT DOCUMENTS

| | | | | |
|---|---|---|---|---|
| 10,637,452 | B2* | 4/2020 | Park ..................... | H03K 23/002 |
| 2002/0063605 | A1* | 5/2002 | Boerstler ............ | H03K 3/0315 |
| | | | | 331/57 |
| 2009/0077147 | A1* | 3/2009 | Hars .................... | H04L 9/0861 |
| | | | | 708/251 |
| 2010/0106757 | A1* | 4/2010 | Matthews, Jr. ........ | G06F 7/58 |
| | | | | 708/251 |

* cited by examiner

*Primary Examiner* — Long Nguyen
(74) *Attorney, Agent, or Firm* — IP & T Group LLP

(57) ABSTRACT

A clock generation circuit includes: a frequency detector suitable for generating an internal clock, and generating a counting signal indicating a toggling number of the internal clock during an activation period of an input clock; a control signal generator suitable for generating a plurality of period control signals based on a target signal and the counting signal, the target signal indicating a target frequency of an output clock; and a period controller suitable for generating the output clock based on the period control signals.

17 Claims, 7 Drawing Sheets

SEMICONDUCTOR DEVICE INCLUDING CLOCK GENERATION CIRCUIT

CROSS-REFERENCE TO RELATED APPLICATION

This application is a continuation of U.S. patent application Ser. No. 16/156,613 filed on Oct. 10, 2018, now issued as U.S. Pat. No. 10,637,452 on Apr. 28, 2020, which claims benefits of priority of Korean Patent Application No. 10-2018-0022738 filed on Feb. 26, 2018. The disclosure of each of the foregoing application is incorporated herein by reference in its entirety.

BACKGROUND

1. Field

Various embodiments of the present invention relate to semiconductor technology, and more particularly, to a clock generation circuit of a semiconductor device.

2. Description of the Related Art

As the operation speed of semiconductor devices continues to increase, the operation speed of a tester used for testing the semiconductor devices may not keep pace with that increase. For example, whereas the semiconductor devices may operate at frequencies up to approximately 400 megahertz (MHz), the tester may not generate signals exceeding approximately 200 MHz. When the tester operates at approximately 200 MHz in performing the testing, not only does it take a long time to perform the test, but it is not possible to perform a test appropriate for a semiconductor device that operates at a high speed.

Therefore, in order to test a high-speed semiconductor device using a tester that operates at a low operation speed, the semiconductor device may include a clock generation circuit, such as a frequency multiplying circuit, which may generate a clock having a frequency that is higher than that of an external clock applied from the tester. In other words, the high-speed operation of the semiconductor device may be tested with low-speed test equipment by using the frequency multiplying circuit.

The frequency multiplying circuit may be implemented using a delay locked loop (DLL) circuit or a phase locked loop (PLL) circuit for small jitter generation and stable operation with respect to process, voltage and temperature (PVT) variations. The frequency multiplying circuit using the DLL or PLL circuit may be able to compensate for a duty ratio. However, the frequency multiplying circuit requires a wide area for disposing the DLL or PLL circuit, and further requires a long locking time and highly complex implementation.

Therefore, a clock generation circuit having a short locking time and simple structure is desired.

SUMMARY

Embodiments of the present invention are directed to an internal clock generation circuit that receives a reference clock from external equipment and generates a desired output clock.

Embodiments of the present invention are directed to an internal clock generation circuit that is used as a frequency multiplying circuit and a frequency dividing circuit.

In accordance with an embodiment of the present invention, a clock generation circuit includes: a frequency detector suitable for generating an internal clock, and generating a counting signal indicating a toggling number of the internal clock during an activation period of an input clock; a control signal generator suitable for generating a plurality of period control signals based on a target signal and the counting signal, the target signal indicating a target frequency of an output clock; and a period controller suitable for generating the output clock based on the period control signals.

In accordance with another embodiment of the present invention, a semiconductor system includes: a test apparatus suitable for providing a semiconductor device with a reference clock; and a semiconductor device suitable for receiving the reference clock and generating an output clock for an operation of the semiconductor device, wherein the semiconductor device includes: a frequency detector suitable for generating an internal clock, and generating a counting signal indicating a toggling number of the internal clock during an activation period of an input clock; a control signal generator suitable for generating a plurality of period control signals based on a target signal and the counting signal, the target signal indicating a target frequency of an output clock; and a period controller suitable for generating the output clock based on the period control signals.

In accordance with yet another embodiment of the present invention, a method for generating a clock includes: generating an internal clock; generating a counting signal by counting the toggling number of the internal clock during an activation period of an input clock; generating a plurality of period control signals based on a target signal and the counting signal when the activation period of the input clock ends, the target signal indicating a target frequency of an output clock; and generating an output clock based on the period control signals.

In accordance with an embodiment of the present invention, a clock generation circuit includes: a frequency detector including a plurality of first unit delayers suitable for generating an internal clock, the frequency detector suitable for counting toggles of the internal clock during an activation period of an input clock and generating a counting signal based on the count; a control signal generator suitable for generating a plurality of period control signals based on a target signal and the counting signal, the target signal indicating a target frequency of an output clock; and a period controller including a plurality of second unit delayers suitable for generating the output clock, the period controller suitable for controlling the number of the second unit delayers that are selected based on the period control signals.

DETAILED DESCRIPTION

Figure 1:
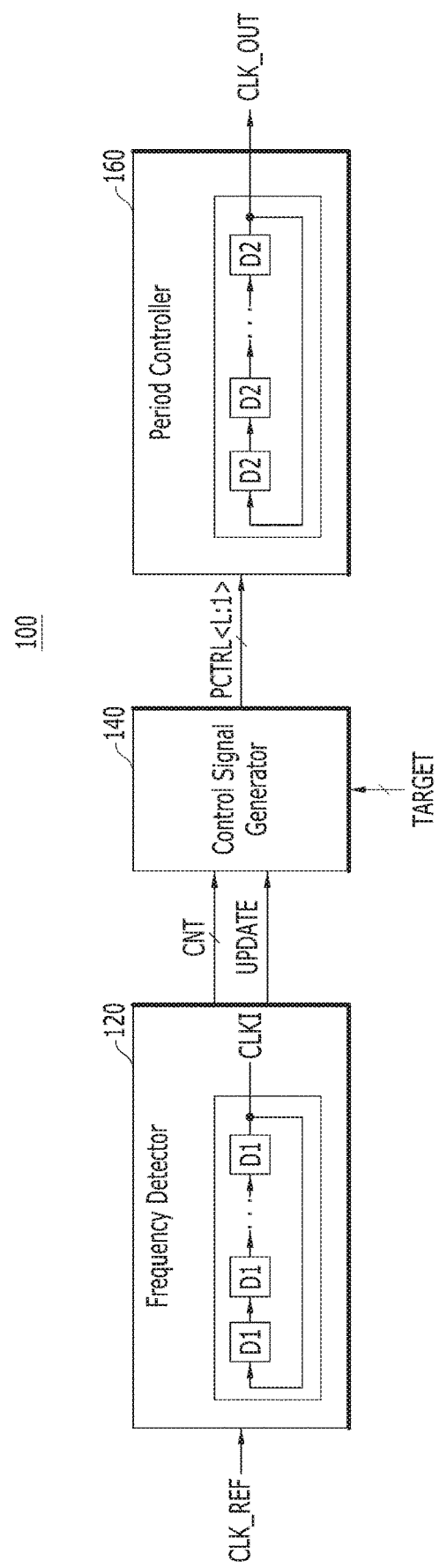
FIG. 1 is a block diagram illustrating a clock generation circuit in accordance with an embodiment of the present invention.

Various embodiments of the present invention will be described below in more detail with reference to the accompanying drawings. The present invention may, however, be embodied in different forms and thus is not limited to the embodiments set forth herein. Rather, these embodiments are provided so that this disclosure is thorough and complete and fully conveys the scope of the present invention to those skilled in the art. Throughout the disclosure, like reference numerals refer to like parts throughout the various figures and embodiments of the present invention. Also, throughout the specification, reference to "an embodiment," "another embodiment," or the like is not necessarily to only one embodiment, and different references to any such phrase is not necessarily to the same embodiment(s).

FIG. 1 is a block diagram illustrating a clock generation circuit 100 in accordance with an embodiment of the present invention.

Referring to FIG. 1, the clock generation circuit 100 may include a frequency detector 120, a control signal generator 140, and a period controller 160.

The frequency detector 120 may include a plurality of first unit delay elements or delayers D1. The frequency detector 120 may generate an internal clock CLKI by using the plurality of first unit delayers D1 and generate a counting signal CNT by counting and detecting the number of times that the internal clock CLKI toggles (which may be referred to as "the toggling number of the internal clock CLKI") during an active period of an input clock CLK_REF. The counting signal CNT may be a signal formed of a plurality of bits.

The first unit delayers D1 may be coupled in series and the internal clock signal CLKI may be outputted from the unit delayer of the last stage among the first unit delayers D1. The output of the unit delayer of the last stage may be fed back into the unit delayer of the first stage as an input so that the first unit delayers D1 may form a feedback loop.

The frequency detector 120 may generate an update signal UPDATE, which is activated when the active period of the input clock CLK_REF ends.

The control signal generator 140 may generate a plurality of period control signals PCTRL<L:1> based on a target signal TARGET and the counting signal CNT when the update signal UPDATE is activated. The target signal TARGET may be formed of a plurality of bits which are inputted from external test equipment (not shown) or a controller (not shown). The target signal TARGET may mean a target frequency of an output clock CLK_OUT compared with the frequency of the input clock CLK_REF. According to an embodiment of the present invention, the target signal TARGET may have a value represented by a real number which is greater than zero. When the target signal TARGET has a value between 0 and 1, the clock generation circuit 100 may operate as a frequency dividing circuit. On the other hand, when the target signal TARGET has a value of 1 or more, the clock generation circuit 100 may operate as a frequency multiplying circuit. For example, when an output clock CLK_OUT having a frequency 8 times as high as the frequency of the input clock CLK_REF is to be generated, the target signal TARGET may be set to 8. For example, when an output clock CLK_OUT having a frequency half that of the input clock CLK_REF is to be generated, the target signal TARGET may be set to ½ (or 0.5).

The period controller 160 may include a plurality of second unit delayers D2. The period controller 160 may generate the output clock CLK_OUT using the plurality of second unit delayers D2 and control the number of the second delayers that may be selected based on the period control signals PCTRL<L:1>. In other words, the period controller 160 may control the number of the second unit delayers that may be used to generate the output clock CLK_OUT based on the period control signal PCTRL<L:1>.

The second unit delayers D2 may be coupled in series and the output clock CLK_OUT may be outputted from the unit delayer of the last stage among the second unit delayers D2. The output of the unit delayer of the last stage may be fed back into the unit delayer of the first stage as an input so that the second unit delayers D2 may form a feedback loop. Each of the second unit delayers D2 may receive a corresponding period control signal among the period control signals PCTRL<L:1>. In short, the number (for example, L) of the second unit delayers D2 may correspond to the number of the period control signals PCTRL<L:1>.

In various embodiments, the delay amount of each of the first unit delayers D1 may be substantially equal to the delay amount of each of the second unit delayers D2. In various embodiments, the number L of the second unit delayers D2 may be greater than or equal to the number K of the first unit delayers D1.

When the update signal UPDATE is activated, the control signal generator 140 may calculate a value X based on the following Equation 1. Then, the control signal generator 140 may generate the period control signals PCTRL<L:1> for selecting the number of the second unit delayers corresponding to a value (K*X) obtained by multiplying the number K of the first unit delayers D1 by the calculated value X.

$$X = \frac{CNT * 2}{TARGET} \quad \text{Equation 1}$$

where CNT denotes a value of the counting signal, and TARGET denotes a value of the target signal.

For example, when the number K of the first unit delayers D1 is 16 and a value of the target signal TARGET is 4 and a value of the counting signal CNT is "10000" (i.e., 16), the control signal generator 140 may calculate the value X as 16*2/4=8 based on the Equation 1 and generate the period control signals PCTRL<L:1> for selecting 128 (i.e., 16*8) second unit delayers D2. For another example, when the number K of the first unit delayers D1 is 16 and a value of the target signal TARGET is ½ and a value of the counting signal CNT is "10000" (i.e., 16), the control signal generator 140 may calculate the value X as 16*2/0.5=64 based on the Equation 1, and generate the period control signals PCTRL<L:1> for selecting 1024 (i.e., 16*64) second unit delayers D2.

As described above, the clock generation circuit 100 may generate the internal clock CLKI that toggles at a predetermined cycle by using K first unit delayers D1, and generate the counting signal CNT by detecting how many times the input clock CLK_REF is as high as the cycle (Le., frequency) of the internal clock CLKI. Then, the clock generation circuit 100 may generate the output clock CLK- _OUT having a frequency corresponding to the target signal TARGET by controlling the number of the second unit delayers that are selected based on the counting signal CNT and the target signal TARGET. Since the clock generation circuit 100 may be implemented in a simple circuit structure with a short locking time, the high-speed test operation may be performed efficiently while minimizing the occupying area. Also, the clock generation circuit 100 may be used both as a frequency multiplying circuit and as a frequency dividing circuit so that the clock generation circuit 100 has a high efficiency. In other words, as the frequency multiplying circuit, the clock generation circuit 100 may receive the input clock CLK_REF having a low frequency and generating the output clock CLK_OUT having a high frequency. Further, as the frequency dividing circuit, the clock generation circuit 100 may receive the input clock CLK_REF having a high frequency and generate the output clock CLK_OUT having a low frequency.

Figure 2:
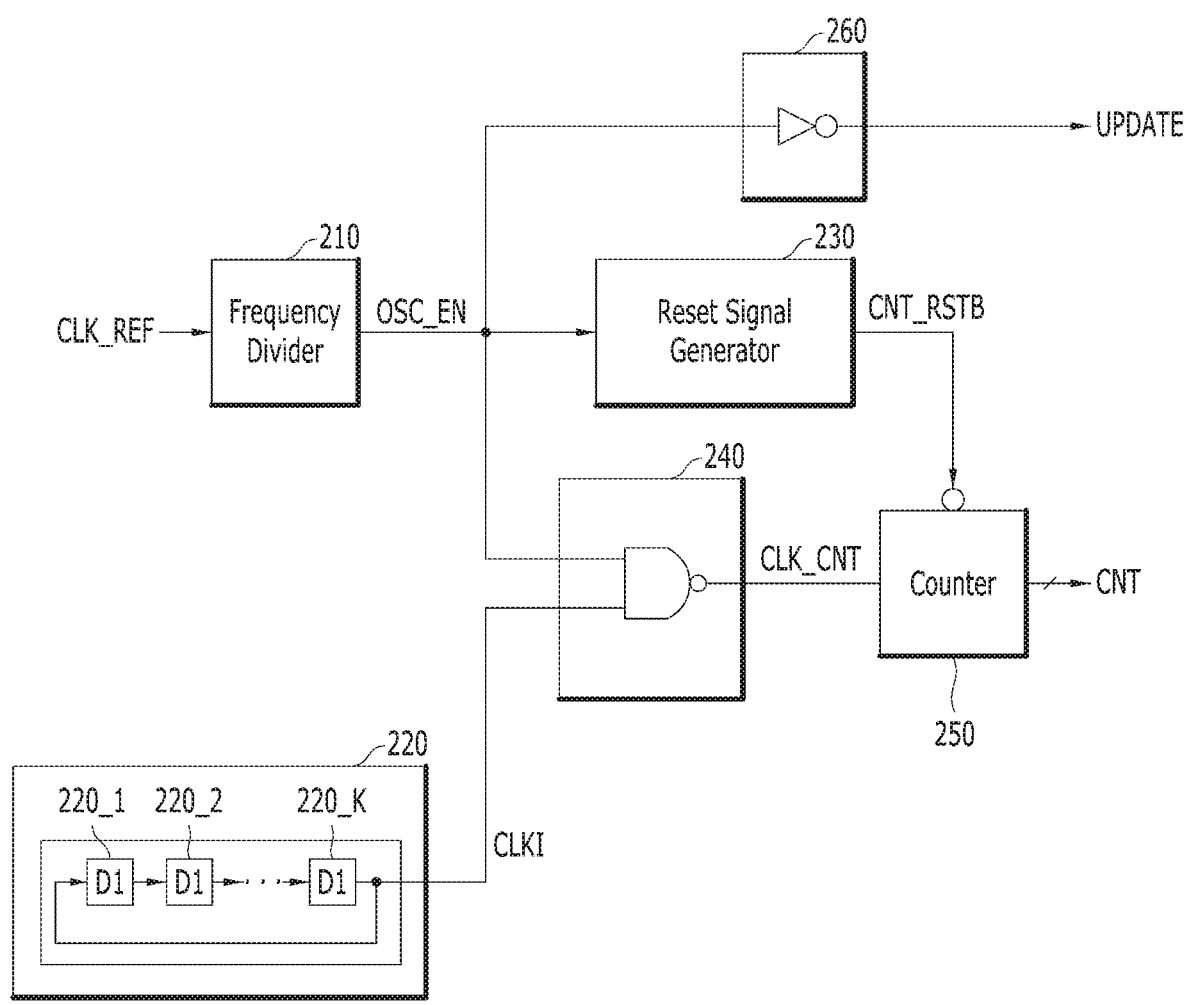
FIG. 2 is a block diagram illustrating a frequency detector in accordance with an embodiment of the present invention.

FIG. 2 is a block diagram illustrating a frequency detector in accordance with an embodiment of the present invention, for example, the frequency detector 120 shown in FIG. 1.

Referring to FIG. 2, the frequency detector 120 may include a frequency divider 210, a ring oscillator 220, a reset signal generator 230, a counting clock generator 240, a counter 250, and an update signal generator 260.

The frequency divider 210 may divide the input clock CLK_REF by a predetermined division ratio N to generate an oscillating clock OSC_EN having a frequency which is lower than or equal to the input clock CLK_REF. The predetermined division ratio N may be set to an integer of 1 or higher. As the oscillating clock OSC_EN having a frequency lower than that of the input clock CLK_REF is generated by using the frequency divider 210, an internal operation margin may be ensured. However, in some embodiments, the frequency divider 210 may be omitted.

The ring oscillator 220 may include a plurality of first unit delayers 220_1 to 220_K that are coupled in series to form a feedback loop and generate the internal clock CLKI.

The reset signal generator 230 may generate a reset signal CNT_RSTB which is activated after a predetermined time passes from when the activation period of the oscillating clock OSC_EN ends. The reset signal CNT_RSTB may maintain a logic high level when deactivated and maintain a logic low level when activated.

The counting clock generator 240 may receive the internal clock CLKI and the oscillating clock OSC_EN, and generate the counting clock CLK_CNT. The counting clock generator 240 may output the internal clock CLKI as the counting clock CLK_CNT during the activation period of the oscillating clock OSC_EN. According to an embodiment of the present invention, the counting clock generator 240 may be implemented as a logic gate for performing a NAND operation on the oscillating clock OSC_EN and the internal clock CLKI.

The counter 250 may receive the counting clock CLK_CNT and count the toggling number of the counting clock CLK_CNT to generate the counting signal CNT. Also, the counter 250 may receive reset signal CNT_RSTB. The counting signal CNT may be reset based on the reset signal CNT_RSTB. According to an embodiment of the present invention, the counting signal CNT may be reset when the reset signal CNT_RSTB is activated to a logic low level.

The update signal generator 260 may receive the oscillating clock OSC_EN and output the update signal UPDATE by inverting the oscillating clock OSC_EN. The update signal generator 260 may be formed of one or more inverters.

Referring again to FIG. 1, when the frequency detector 120 is provided with the frequency divider 210 as shown in FIG. 2, the control signal generator 140 may calculate a value Y based on the following Equation 2 when the update signal UPDATE is activated, and generate the period control signals PCTRL<L:1> for selecting the number of second unit delayers which corresponds to a value (K*Y) that is obtained by multiplying the number K of the first unit delayers 220_1 to 220_K by the calculated value Y.

$$Y = \frac{CNT * 2}{N * TARGET} \qquad \text{Equation 2}$$

where CNT denotes a value of the counting signal, and TARGET denotes a value of the target signal, and N denotes the division ratio of the frequency divider.

For example, when the number K of the first unit delayers D1 is 16 and a value of the target signal TARGET is 4 and a value of the counting signal CNT is "10000" (i.e., 16), the control signal generator 140 may calculate the value Y as 16*2/2*4 =4 based on the Equation 2 and generate the period control signals PCTRL<L:1> for selecting 64 (i.e., 16*4) second unit delayers D2. For another example, when the number K of the first unit delayers D1 is 16 and a value of the target signal TARGET is ½ and a value of the counting signal CNT is "10000" (i.e., 16), the control signal generator 140 may calculate the value Y as 16*2/2*0.5=32 based on the Equation 2, and generate the period control signals PCTRL<L:1> for selecting 512 (i.e., 16*32) second unit delayers D2.

Figure 3:
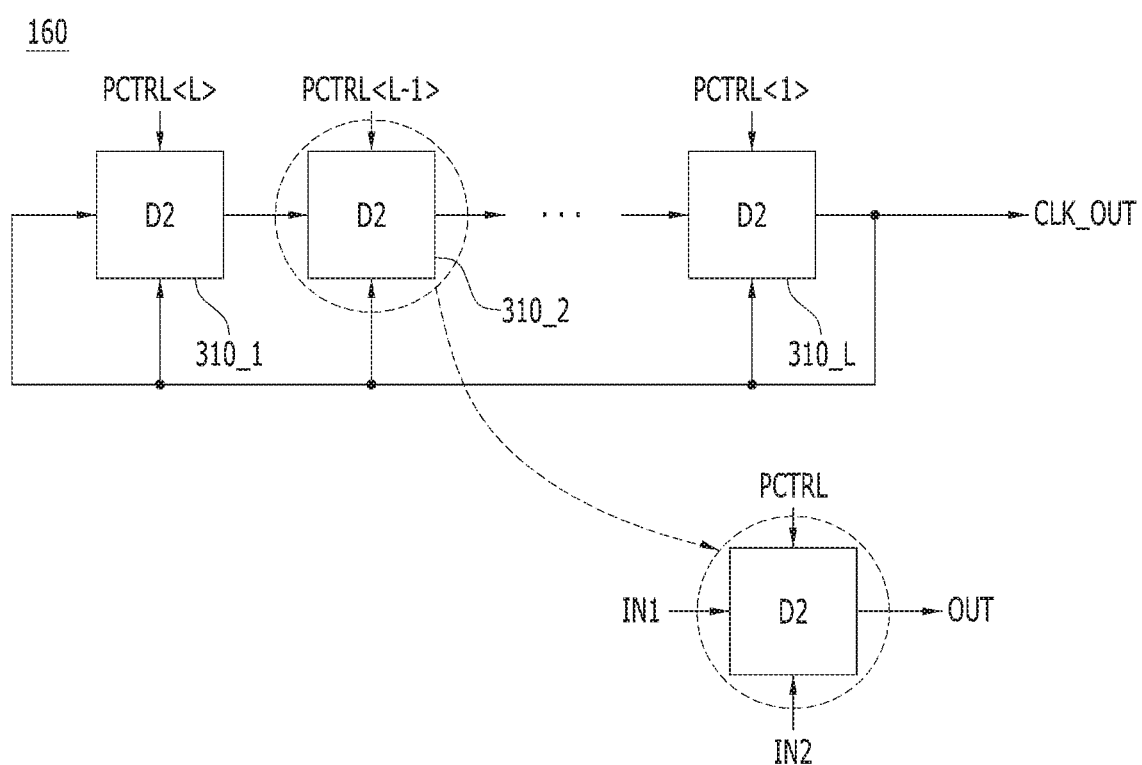
FIG. 3 is a block diagram illustrating a period controller in accordance with an embodiment of the present invention.
Figure 4:
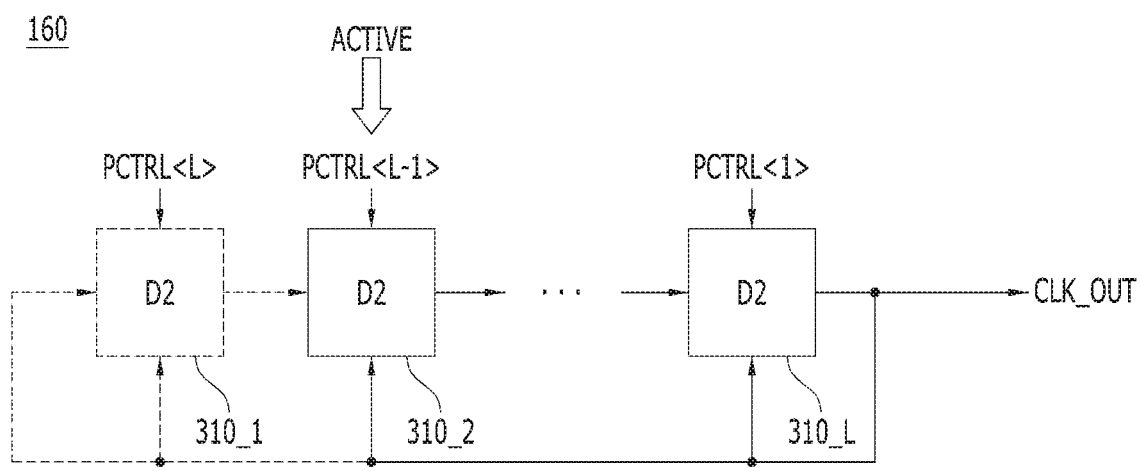
FIG. 4 is a block diagram illustrating an operation of the period controller in accordance with an embodiment of the present invention.

FIG. 3 is a block diagram illustrating a period controller in accordance with an embodiment of the present invention, for example, the period controller 160 shown in FIG. 1. FIG. 4 illustrates an operation of a period controller in accordance with an embodiment of the present invention, for example, the period controller 160 shown in FIG. 3.

Referring to FIG. 3, the period controller 160 may include a plurality of second unit delayers 310_1 to 310_L that are coupled in series to form a feedback loop.

The second unit delayers 310_1 to 310_L may operate differently than the first unit delayers 220_1 to 220_K of FIG. 2, in that the output clock CLK_OUT which is outputted from the unit delayer 310_L of the last stage may be fed back into all the second unit delayers 310_1 to 310_L. In other words, the second unit delayers 310_1 to 310_L may select the output of the unit delayer of the previous stage, which is inputted as the first input IN1, or the output clock CLK_OUT, which is inputted as the second input IN2, and generate the output clock CLK_OUT by oscillating the selected one in a predetermined number of times. The unit delayer 310_1 of the first stage among the second unit delayers 310_1 to 310_1 may receive the output clock CLK_OUT as the first input IN1 and the second input IN2 in common.

Each of the second unit delayers 310_1 to 310_L may receive the corresponding period control signal among the period control signals PCTRL<L:1> in reverse order. For example, as illustrated in FIG. 3, the second unit delayer 310_1 of the first stage may receive an $L^{th}$ period control signal PCTRL<L> among the period control signals PCTRL<L:1>, and the second unit delayer 310_2 of the second stage may receive the $(L-1)^{th}$ period control signal PCTRL<L-1> among the period control signals PCTRL<L:1>. In this way, the unit delayer 310_L of the last stage may receive the first period control signal PCTRL<1> among the period control signals PCTRL<L:1>.

The number of the second unit delayers 310_1 to 310_L used to generate the output clock CLK_OUT may be determined based on the period control signal activated among the period control signals PCTRL<L:1>. For example, as shown in FIG. 4, when the (L−1)$^{th}$ period control signal PCTRL<L−1> is activated, the second unit delayer 310_2 of the second stage may select the output clock CLK_OUT that is inputted as the second input IN2, and thereby the (L−1) second unit delayers 310_2 to 310_L may be used to generate the output clock CLK_OUT.

Figure 5:
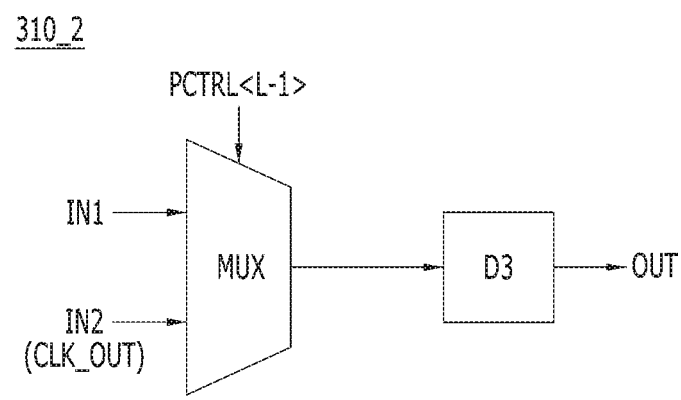
FIG. 5 is a circuit diagram illustrating a second unit delayer in accordance with an embodiment of the present invention.

FIG. 5 is a circuit diagram illustrating a second unit delayer in accordance with an embodiment of the present invention, for example, a second unit delayer 310_2 of the second stage which is shown in FIG. 3. The other second unit delayers 310_1 and 310_3 to 310_L may have substantially the same structure as the second unit delayer 310_2.

Referring to FIG. 5, the second unit delayer 310_2 may include a multiplexer MUX and a third unit delayer D3.

The multiplexer MUX may select the output of the previous stage, that is, the output of the unit delayer 310_1 of the first stage, which is inputted as the first input IN1, or the output clock CLK_OUT, which is inputted as the second input IN2, based on the (L−1)$^{th}$ period control signal PCTRL<L−1>, and output it as the output OUT. The multiplexer MUX may select the output clock CLK_OUT which is inputted as the second input IN2 when the (L−1)$^{th}$ period control signal PCTRL<L−1> is activated.

The third unit delayer D3 may delay the output of the multiplexer MUX by a predetermined time and output the delayed output of the multiplexer MUX. The delay amount of the third unit delayer D3 may be substantially equal to the delay amount of each of the first unit delayers 220_1 to 220_K of FIG. 2.

Operation of the clock generation circuit according to an embodiment of the present invention will be described with reference to FIGS. 1 to 6B.

Figure 6A:
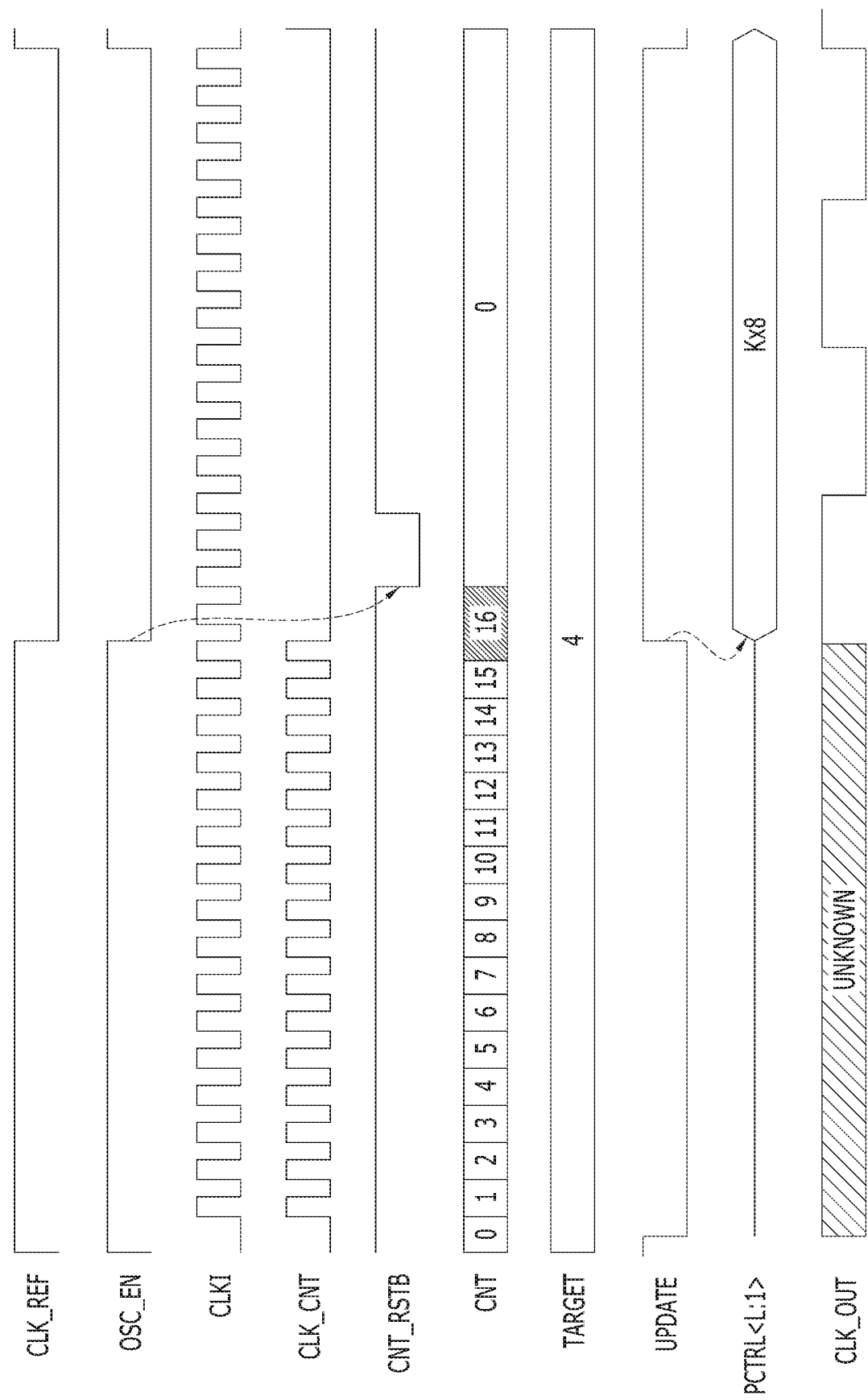
FIGS. 6A and 6B are timing diagrams illustrating examples of an operation of a clock generation circuit in accordance with an embodiment of the present invention.
Figure 6B:
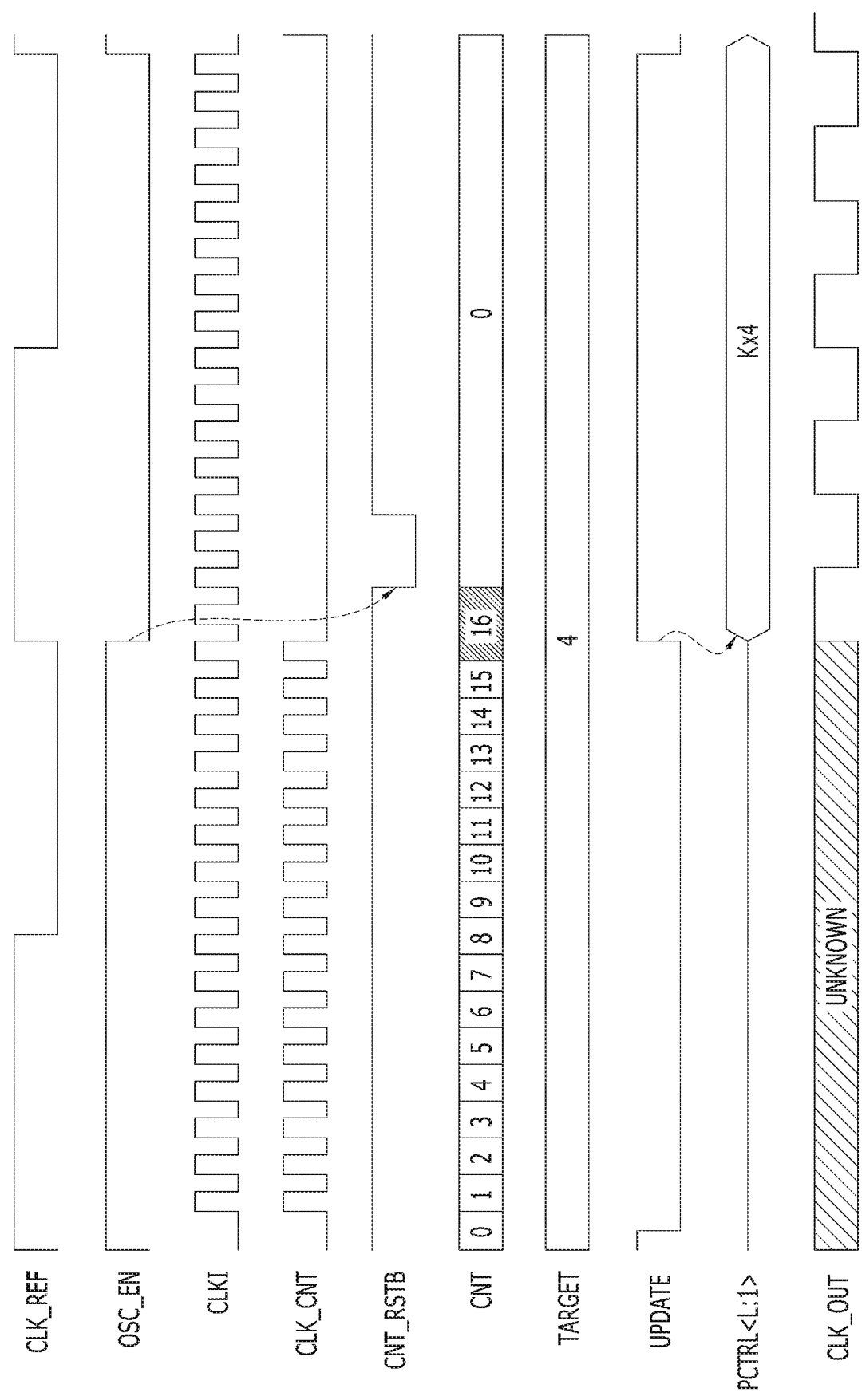

FIGS. 6A and 6B are timing diagrams illustrating an example of an operation of a clock generation circuit in accordance with an embodiment of the present invention, for example, the clock generation circuit 100 shown in FIG. 1. FIGS. 6A and 6B show an example in which the clock generation circuit operates of FIG. 1 as a frequency multiplying circuit.

FIG. 6A shows a case where the target frequency of the output clock CLK_OUT is 4 times (that is, TARGET=4) as high as the frequency of the input clock CLK_REF, and the frequency division ratio N of the frequency divider 210 of FIG. 2 is 1.

Referring to FIG. 6A, when the division ratio N is 1, the frequency divider 210 may output the oscillation clock OSC_EN having the same frequency as the frequency of the input clock CLK_REF.

The first unit delayers 220_1 to 220_K of the ring oscillator 220 may generate the internal clock CLKI that toggles at a predetermined cycle. The counting clock generator 240 may output the internal clock CLKI as the counting clock CLK_CNT during the activation period of the oscillating clock OSC_EN. The counter 250 may count the toggling number of the counting clock CLK_CNT to generate a counting signal CNT.

The reset signal generator 230 may activate a reset signal CNT_RSTB after a predetermined time passes after the activation period of the oscillating clock OSC_EN ends. The counter 250 may reset the counting signal CNT based on the reset signal CNT_RSTB.

The update signal generator 260 may invert the oscillating clock OSC_EN and output the inverted oscillating clock OSC_EN as the update signal UPDATE. When the update signal UPDATE is activated, the control signal generator 140 of FIG. 1 may calculate a value Y based on the Equation 2, and generate the period control signals PCTRL<L:1> for selecting the number of the second unit delayers. The number of the second unit delayers may correspond to a value K*Y which is obtained by multiplying the number K of the first unit delayers 220_1 to 220_K by the calculated value Y. For example, when the number K of the first unit delayers 220_1 to 220_K is 5, the control signal generator 140 may calculate the value Y as 16*2/1*4=8 based on the Equation 2, and generate the period control signals PCTRL<L:1> for selecting 40 (i.e., 5*8) second unit delayers 310_1 to 310_L.

The period controller 160 of FIG. 1 may generate the clock CLK_OUT by using 40 second unit delayers 310_1 to 310_L among the second unit delayers 310_1 to 310_L based on the period control signals PCTRL<L:1>. Through the above process, an output clock CLK_OUT having a frequency four times as high as the frequency of the input clock CLK_REF may be generated after the update signal UPDATE is activated.

When each of the second unit delayers 310_1 to 310_L is implemented as an inverter, an odd number of unit delayers may be required to generate a clock. Therefore, when an even number of unit delayers are selected, one unit delayer may be added or subtracted to keep the number of the unit delayers an odd number. Also, the value K*Y obtained by multiplying the number K of the first unit delayers 220_1 to 220_K by the calculated value Y which is obtained based on the Equation 2 may not be an integer according to the value of the target signal TARGET. The control signal generator 140 may estimate an integer which is close to the result value K*Y, and generate the period control signals PCTRL<L:1> for selecting the number of the second unit delayers 310_1 to 310_L corresponding to the estimated integer.

FIG. 6B shows a case where the target frequency of the output clock CLK_OUT is 4 times (that is, TARGET=4) as high as the frequency of the input clock CLK_REF, and the frequency division ratio N of the frequency divider 210 of FIG. 2 is 2.

Referring to FIG. 6B, when the division ratio N is 2, the frequency divider 210 may divide the frequency of the input clock CLK_REF by 2 and output the oscillation clock OSC_EN having a ½ frequency (that is, cycle of two times) of the input clock CLK_REF.

The first unit delayers 220_1 to 220_K of the ring oscillator 220 may generate the internal clock CLKI that toggles at a predetermined cycle. The counting clock generator 240 may output the internal clock CLKI as the counting clock CLK_CNT during the activation period of the oscillating clock OSC_EN. The counter 250 may count the toggling number of the counting clock CLK_CNT to generate a counting signal CNT.

The reset signal generator 230 may activate a reset signal CNT_RSTB after a predetermined time passes after the activation period of the oscillating clock OSC_EN ends. The counter 250 may reset the counting signal CNT based on the reset signal CNT_RSTB.

The update signal generator 260 may invert the oscillating clock OSC_EN and output the inverted oscillating clock OSC_EN as the update signal UPDATE.

When the update signal UPDATE is activated, the control signal generator 140 of FIG. 1 may calculate a value Y based on the Equation 2, and generate the period control signals PCTRL<L:1> for selecting the number of the second unit delayers. The number of the second unit delayers may correspond to a value K*Y which is obtained by multiplying the number K of the first unit delayers 220_1 to 220_K by the calculated value Y. For example, when the number K of the first unit delayers 220_1 to 220_K is 5, the control signal generator 140 may calculate the value Y as 16*2/2*4=4 based on the Equation 2, and generate the period control signals PCTRL<L:1> for selecting 20 (i.e., 5*4) second unit delayers 310_1 to 310_L.

The period controller 160 of FIG. 1 may generate the clock CLK_OUT by using 20 second unit delayers 310_1 to 310_L among the second unit delayers 310_1 to 310_L based on the period control signals PCTRL<L:1>. Through the above process, an output clock CLK_OUT having a frequency four times as high as the frequency of the input clock CLK_REF may be generated.

Although FIGS. 6A and 6B show an example in which the clock generating circuit operates as a frequency multiplying circuit, the clock generating circuit may also operate as a frequency dividing circuit based on the same principle.

Figure 7:
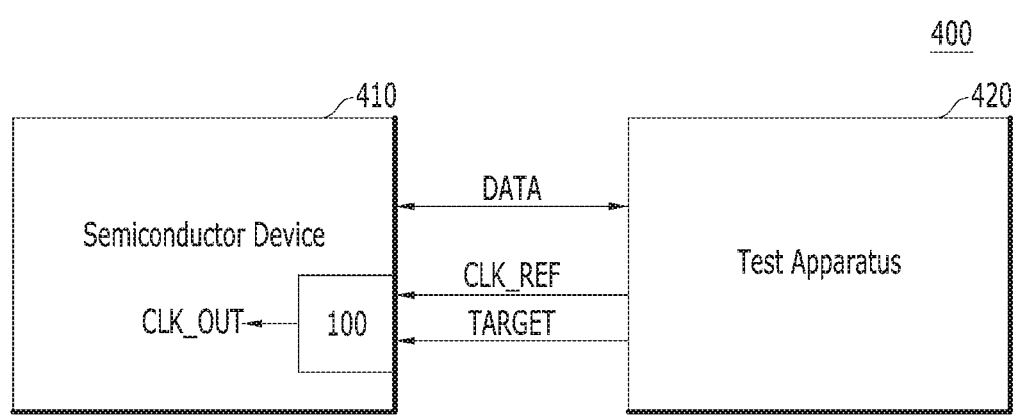
FIG. 7 is a block diagram illustrating a semiconductor system in accordance with an embodiment of the present invention.

FIG. 7 is a block diagram illustrating a semiconductor system 400 in accordance with an embodiment of the present invention.

Referring to FIG. 7, the semiconductor system 400 may include a semiconductor device 410 and a test apparatus 420. The operation speed of the test apparatus 420 may be different from that of the semiconductor device 410.

The test apparatus 420 may provide the semiconductor device 410 with data DATA and a reference clock CLK_REF that are required for testing the semiconductor device 410. The semiconductor device 410 may perform a test operation based on the data DATA and the reference clock CLK_REF. The test apparatus 420 may provide the semiconductor device 410 with a target signal TARGET which means a target frequency of the output clock CLK_OUT with respect to the frequency of the reference clock CLK_REF.

Since the operation speed of the test apparatus 420 is different from the operation speed of the semiconductor device 410, the test apparatus 420 may provide the semiconductor device 410 with a target signal which indicates the target frequency of the output clock CLK_OUT with respect to the frequency of the reference clock CLK_REF. The semiconductor device 410 may include the clock generation circuit 100 for generating the output clock CLK_OUT required for the operation of the semiconductor device 410 based on the reference clock CLK_REF and the target signal TARGET.

The clock generation circuit 100 may operate as a frequency multiplying circuit that receives the input clock CLK_REF having a low frequency and generates the output clock CLK_OUT having a high frequency. Alternatively, the clock generation circuit 100 may operate as a frequency dividing circuit that receives the input clock CLK_REF having a high frequency and generates the output clock CLK_OUT having a low frequency. Since the clock generation circuit 100 has substantially the same structure of the clock generation circuit 100 shown in FIG. 1, further description of it is omitted here.

According to embodiments of the present invention, a semiconductor device may use one clock generation circuit both as a frequency multiplying circuit and as a frequency dividing circuit.

When an internal test such as a built-in self-test (BIST) is performed, there is no problem in a test operation even if the clock does not have an exact frequency. A clock generation circuit may have a short locking time and simple structure may be desired for the test operation. According to embodiments of the present invention, the semiconductor device may effectively perform a high-speed test operation and minimize the area occupied by the clock generation circuit for generating an internal clock for the test operation.

While the present invention has been described with respect to the specific embodiments, it will be apparent to those skilled in the art that various changes and modifications may be made without departing from the spirit and scope of the invention as defined in the following claims. The present invention encompasses all such changes and modifications that fall within the scope of the claims.

For example, a logic gate and a transistor in embodiments of the present invention described above may be realized in different positions and configurations according to the polarity of an inputted signal.

What is claimed is:

1. A clock generation circuit, comprising:
   a frequency detector including a plurality of first unit delayers, and suitable for generating an internal clock, and generating a counting signal indicating a toggling number of the internal clock during an activation period of an input clock;
   a control signal generator suitable for generating a plurality of period control signals based on a target signal and the counting signal, the target signal indicating a frequency of an output clock compared to a frequency of the input clock; and
   a period controller including a plurality of second unit delayers each of which has a delay amount substantially the same as a delay amount of each of the first unit delayers, and suitable for generating the output clock by controlling the number of the second unit delayers according to the period control signals,
   wherein the clock generation circuit operates as a frequency dividing circuit when the target signal has a value between 0 and 1, and operates as a frequency multiplying circuit when the target signal has a value of 1 or more.

2. The clock generation circuit of claim 1, wherein the number of the second unit delayers is equal to or greater than the number of the first unit delayers.

3. The clock generation circuit of claim 1, wherein the frequency detector generates an update signal that is activated when the activation period of the input clock ends, and
   the control signal generator compares the target signal with the counting signal based on the update signal.

4. The clock generation circuit of claim 3, wherein the frequency detector includes:
   the plurality of first unit delayers that are coupled in series to form a feedback loop for generating the internal clock;
   a reset signal generator suitable for generating a reset signal that is activated after the activation period of the input clock ends; and
   a counter suitable for generating the counting signal by counting the toggling number of the internal clock during the activation period of the input clock, and resetting the counting signal based on the reset signal.

5. The clock generation circuit of claim 4, wherein the frequency detector further includes:
   a frequency divider suitable for generating an oscillating clock by dividing the frequency of the input clock and providing the reset signal generator with the oscillating clock; and an update signal generator suitable for inverting the oscillating clock and outputting the update signal.

6. The clock generation circuit of claim 1, wherein the control signal generator determines a value X based on an equation:

$$X = \frac{CNT * 2}{TARGET}$$

where CNT denotes a value of the counting signal, and TARGET denotes a value of the target signal, and the control signal generator generates the period control signals corresponding to a value K*X which is obtained by multiplying the number K of the first unit delayers by the value X.

7. The clock generation circuit of claim 1, wherein the second unit delayers are coupled in series to form a feedback loop, and generate the output clock by selectively receiving an output of a second unit delayer of a previous stage or the output clock based on the period control signals.

8. The clock generation circuit of claim 1, wherein each of the second unit delayers includes:
   a multiplexer suitable for selecting and outputting an output of a second unit delayer of a previous stage or the output clock based on a corresponding period control signal among the period control signals; and
   a third unit delayer suitable for delaying an output of the multiplexer and outputting the delayed output of the multiplexer.

9. The clock generation circuit of claim 8, wherein a delay amount of the third unit delayer is substantially the same as a delay amount of each of the first unit delayers.

10. A semiconductor system, comprising:
    a test apparatus suitable for providing a semiconductor device with a reference clock; and
    a semiconductor device suitable for receiving the reference clock and generating an output clock for an operation of the semiconductor device,
    wherein the semiconductor device includes:
       a frequency detector including a plurality of first unit delayers, and suitable for generating an internal clock, and generating a counting signal indicating a toggling number of the internal clock during an activation period of an input clock;
       a control signal generator suitable for generating a plurality of period control signals based on a target signal and the counting signal, the target signal indicating a frequency of the output clock compared to a frequency of the input clock; and
       a period controller including a plurality of second unit delayers each of which has a delay amount substantially the same as a delay amount of each of the first unit delayers, and suitable for generating the output clock by controlling the number of the second unit delayers according to the period control signals, and
       wherein the semiconductor device operates as a frequency dividing circuit when the target signal has a value between 0 and 1, and operates as a frequency multiplying circuit when the target signal has a value of 1 or more.

11. The semiconductor system of claim 10, wherein the frequency detector includes:
    the plurality of first unit delayers that are coupled in series to form a feedback loop for generating the internal clock;
    a reset signal generator suitable for generating a reset signal that is activated after the activation period of the input clock ends; and
    a counter suitable for generating the counting signal by counting the toggling number of the internal clock during the activation period of the input clock, and resetting the counting signal based on the reset signal.

12. The semiconductor system of claim 10, wherein the control signal generator determines a value X based on an equation:

$$X = \frac{CNT * 2}{TARGET}$$

where CNT denotes a value of the counting signal, and TARGET denotes a value of the target signal, and the control signal generator generates the period control signals corresponding to a value K*X which is obtained by multiplying the number K of the first unit delayers by the value X.

13. The semiconductor system of claim 10, wherein the second unit delayers are coupled in series to form a feedback loop, and
    each of the second unit delayers includes:
       a multiplexer suitable for selecting and outputting an output of a second unit delayer of a previous stage or the output clock based on a corresponding period control signal among the period control signals; and
       a third unit delayer suitable for delaying an output of the multiplexer and outputting the delayed output of the multiplexer.

14. The semiconductor system of claim 13, wherein a delay amount of the third unit delayer is substantially the same as a delay amount of each of the first unit delayers.

15. A method for generating a clock, comprising:
    generating an internal clock using a plurality of first unit delayers that are coupled in series to form a feedback loop;
    generating a counting signal by counting the toggling number of the internal clock during an activation period of an input clock;
    generating a plurality of period control signals based on a target signal and the counting signal when the activation period of the input clock ends, the target signal indicating a frequency of an output clock compared to a frequency of the input clock; and
    generating an output clock using plurality of second unit delayers that are coupled in series to form a feedback loop, while controlling the number of the second unit delayers according to the period control signals, wherein a delay amount of each of the first unit delayers is substantially the same as a delay amount of each of the second unit delayers,
    wherein the output clock has a frequency lower than that of the input clock when the target signal has a value between 0 and 1, and has a frequency higher than or equal to that of the input clock when the target signal has a value of 1 or more.

16. The method of claim 15, wherein the generating of the period control signals includes:
    calculating a value X based on an equation:

$$X = \frac{CNT * 2}{TARGET}$$

where CNT denotes a value of the counting signal, and TARGET denotes a value of the target signal, and generating the period control signals corresponding to a value K*X which is obtained by multiplying the number K of the first unit delayers by the value X.

17. The method of claim 15, wherein the controlling of the selected number of the second unit delayers includes:

selecting a second unit delayer that corresponds to an activated period control signal among the second unit delayers that are coupled in series; and inputting the output clock to the selected second unit delayer.

* * * * *